(12) United States Patent
Li et al.

(10) Patent No.: US 6,406,953 B1
(45) Date of Patent: Jun. 18, 2002

(54) METHOD FOR FABRICATING AN INTEGRATED CIRCUIT WITH A TRANSISTOR ELECTRODE

(75) Inventors: Li-Chun Li, Los Gatos, CA (US); Huoy-Jong Wu, Taichung (TW); Chung-Cheng Wu, Tou-Cheng (TW); Saysamone Pittikoun, Hsinchu (TW); Wen-Wei Lo, Pan Chiao (TW)

(73) Assignee: Mosel Vitelic, Inc. (TW)

( * ) Notice: Subject to any disclaimer, the term of this patent is extended or adjusted under 35 U.S.C. 154(b) by 0 days.

(21) Appl. No.: 09/053,557

(22) Filed: Apr. 1, 1998

Related U.S. Application Data

(62) Division of application No. 08/900,560, filed on Jul. 25, 1997, now Pat. No. 6,133,597.

(51) Int. Cl.[7] .......................................... H01L 21/8238

(52) U.S. Cl. ....................................... 438/199; 438/224

(58) Field of Search ................................. 438/199, 179, 438/181, 185, 224, 228; 257/371, 341, 378; 365/185.27

(56) References Cited

U.S. PATENT DOCUMENTS

| | | |
|---|---|---|
| 5,281,842 A | 1/1994 | Yasuda et al. |
| 5,293,055 A | 3/1994 | Hara et al. |
| 5,297,097 A | 3/1994 | Etoh et al. |
| 5,348,905 A | 9/1994 | Kenney |
| 5,349,218 A | 9/1994 | Tadaki et al. |
| 5,373,476 A | 12/1994 | Jeon |
| 5,384,474 A | 1/1995 | Park et al. |
| 5,397,734 A | 3/1995 | Iguchi et al. |
| 5,404,042 A | 4/1995 | Okumura et al. ........... 257/371 |
| 5,489,546 A * | 2/1996 | Ahmad et al. .............. 438/224 |
| 5,515,319 A * | 5/1996 | Smayling et al. ...... 365/185.27 |
| 5,521,115 A | 5/1996 | Park et al. |
| 5,595,925 A | 1/1997 | Chen et al. |
| 5,618,740 A | 4/1997 | Huang |
| 5,728,612 A * | 3/1998 | Wei et al. ..................... 438/228 |
| 5,798,552 A * | 8/1998 | Alavi et al. .................. 257/371 |
| 5,808,345 A * | 9/1998 | Kinzer ........................ 257/378 |
| 6,005,271 A * | 12/1999 | Hshieh ........................ 257/341 |

OTHER PUBLICATIONS

U. S. Patent application Ser. No. 08/760,121, filed Dec. 3, 1996, by L. Liu et al., entitled "Charging a Sense Amplifier". Now U. S. Patent 5,768,200.

R. Rountree et al., "A Process–Tolerant Input Protection Circuit For Advanced CMOS Processes"; Electrical Overstress/Electrostatic Discharge Symposium Proceedings; Anaheim, CA; Sep. 27–29, 1988, pp. 201–205.

(List continued on next page.)

Primary Examiner—Long Pham
Assistant Examiner—William David Coleman
(74) Attorney, Agent, or Firm—Skjerven Morrill MacPherson LLP

(57) ABSTRACT

Dynamic Random Access Memory (DRAM) cells are formed in a P well formed in a biased deep N well (DNW). PMOS transistors are formed in N wells. The NMOS channels stop implant mask is modified not to be a reverse of the N well mask in order-to block the channels stop implant from an N+ contact region used for DNW biasing. In DRAMS and other integrated circuits, a minimal spacing requirement between a well of an integrated circuit on the one hand and adjacent circuitry on the other hand is eliminated by laying out the adjacent circuitry so that the well is located adjacent to a transistor having an electrode connected to the same voltage as the voltage that biases the well. For example, in DRAMs, the minimal spacing requirement between the DNW and the read/write circuitry is eliminated by locating the DNW next to a transistor precharging the bit lines before memory accesses. One electrode of the transistor is connected to a precharge voltage. This electrode overlaps the DNW which is biased to the same precharge voltage. This electrode provides the DNW N+ contact region.

8 Claims, 7 Drawing Sheets

OTHER PUBLICATIONS

R. Chapman, et al., "An 0.8μm CMOS Technology For High Performance Logic Applications", International Electron Devices Meeting Technical Digest, Washington, D. C., Dec. 6–9, 1987, pp. 362–365.

G. Rieck, et al., "Novel ESD Protection For Advanced CMOS Output Drivers"; Electrical Overstress/Electrostatic Discharge Symposium Proceedings; New Orleans, LA; Sep. 26–28, 1989; pp. 182–189.

L. R. Avery, "Using SCR's As Transient Protection Structures In Integrated Circuits"; Electrical Overstress/Electrostatic Discharge Symposium Proceedings; Las Vegas, NV, Sep. 27–29, 1983, pp. 177–180.

Chatterjee et al., "A Low–Voltage Triggering SCR for On–Chip ESD Protection at Output and Input Pads", IEEE Electron Devices, Jan. 1991, vol. 12, No. 1, pp. 21–22.

* cited by examiner

METHOD FOR FABRICATING AN INTEGRATED CIRCUIT WITH A TRANSISTOR ELECTRODE

This application is a divisional of Ser. No. 08/900,560, filed Jul. 25, 1997, now U.S. Pat. No. 6,133,597.

BACKGROUND OF THE INVENTION

The present invention relates to semiconductor circuits, and more particularly to wells used in semiconductor circuits.

Some semiconductor circuits use wells biased at a predetermined voltage to obtain needed functionality or performance characteristics. For example, biased wells can be used to isolate transistors from each other. Thus, in some dynamic random access memories (DRAMs), NMOS transistors of DRAM cells are formed in a P-well formed in a biased deep N well (DNW) that isolates the P well from the P doped substrate. The P well itself is biased at a lower voltage than the substrate. Hence, the body regions of DRAM cell transistors in the P well are biased at a lower voltage that the body regions of NMOS transistors of read/write circuitry (for example, of sense amplifiers) that are fabricated in the substrate. The lower bias voltage in the P well reduces the leakage current through the DRAM cell transistors. The leakage current through these transistors is of concern because it could discharge the cells. At the same time, the lower bias voltage is not suitable for read/write NMOS transistors because the lower bias voltage would make these transistors slower. (Of note, the leakage current is not as big a concern for the read/write transistors as for the DRAM cell transistors.) The biased DNW isolates the DRAM cell transistors from the read/write transistors.

In order to improve the electrical contact between a voltage source biasing the DNW and the DNW itself, the DNW is provided with a low-resistance, heavily-doped N+ contact region located at the substrate surface. The N+ contact region is formed in a separate N well which itself is formed in the DNW. The reason for the separate N well is as follows.

One of the DRAM fabrications steps is a channel stop implant. The channel stop implant is a P-type implant performed into the NMOS transistor active areas and into field isolation regions. The purpose of the channel stop implant is to increase the punch-through voltages of NMOS transistors and the punch-through and threshold voltages of parasitic field transistors. The channel stop implant is blocked from N wells in which PMOS transistors are formed. To simplify mask generation, the mask for the channel stop implant is made to be a reverse of the mask used for the N-type implant that creates the N wells. Thus, the channel stop implant is implanted precisely into those areas which are blocked from the N-well implant.

Besides the N wells containing the PMOS transistors, the channel stop implant is also blocked from the N+ contact region used to bias the DNW. This is done to prevent the channel stop P-type dopant from impeding electrical contact between the N+ contact region and the DNW. In order to enable the channel stop implant mask to be the reverse of the N well mask and still to block the channel stop implant from the N+ contact region, the N+ contact region is formed in the separate N well which is formed with the same N well mask as used for the N wells containing-the PMOS transistors.

It is desirable to reduce spacings associated with wells in the integrated circuit. Of note, a minimal spacing is typically required between a well and transistors outside the well. For example, in DRAMs a minimal spacing is required between the DNW and read/write circuitry transistors. It is desirable to reduce such spacings.

SUMMARY OF THE INVENTION

According to the present invention, integrated circuit spacing requirements are reduced. In some embodiments, spacing requirements between wells and transistors outside the wells are eliminated. Therefore, the integrated circuit size can be reduced.

More particularly, in some embodiments, the separate N wells containing the N+ contact regions in the DNWs are eliminated. This is made possible by modifying the channel stop mask not to be a reverse of the N well mask.

Further, spacing requirements between wells and transistors outside the wells are eliminated as follows. When transistors outside the well (e.g., a DNW) are laid out, the transistor placed adjacent to the well is a transistor that can be used to bias the well. This transistor couples a predetermined voltage from one of its electrodes to the other. For example, in a DRAM, this transistor can be a precharge transistor that couples a predetermined voltage to a bit line to precharge the bit line before a memory access (e.g., a memory read operation). The predetermined voltage is also suitable to bias the well. The transistor electrode that receives the predetermined voltage is at least partially inside the well, biasing the well to the predetermined voltage. Therefore, the minimal spacing requirement between the well and the transistor is eliminated.

In some DRAM embodiments, the channel stop implant mask blocks at least a portion of an area in which the DNW overlaps the precharge transistor drain region. Hence, the channel stop P dopant is prevented from impeding the electrical contact between the DNW and the drain region.

In some embodiments, P and N conductivity types are reversed.

Other features of the invention are described below. The invention is defined by the appended claims.

DESCRIPTION OF PREFERRED EMBODIMENTS

Figure 1:
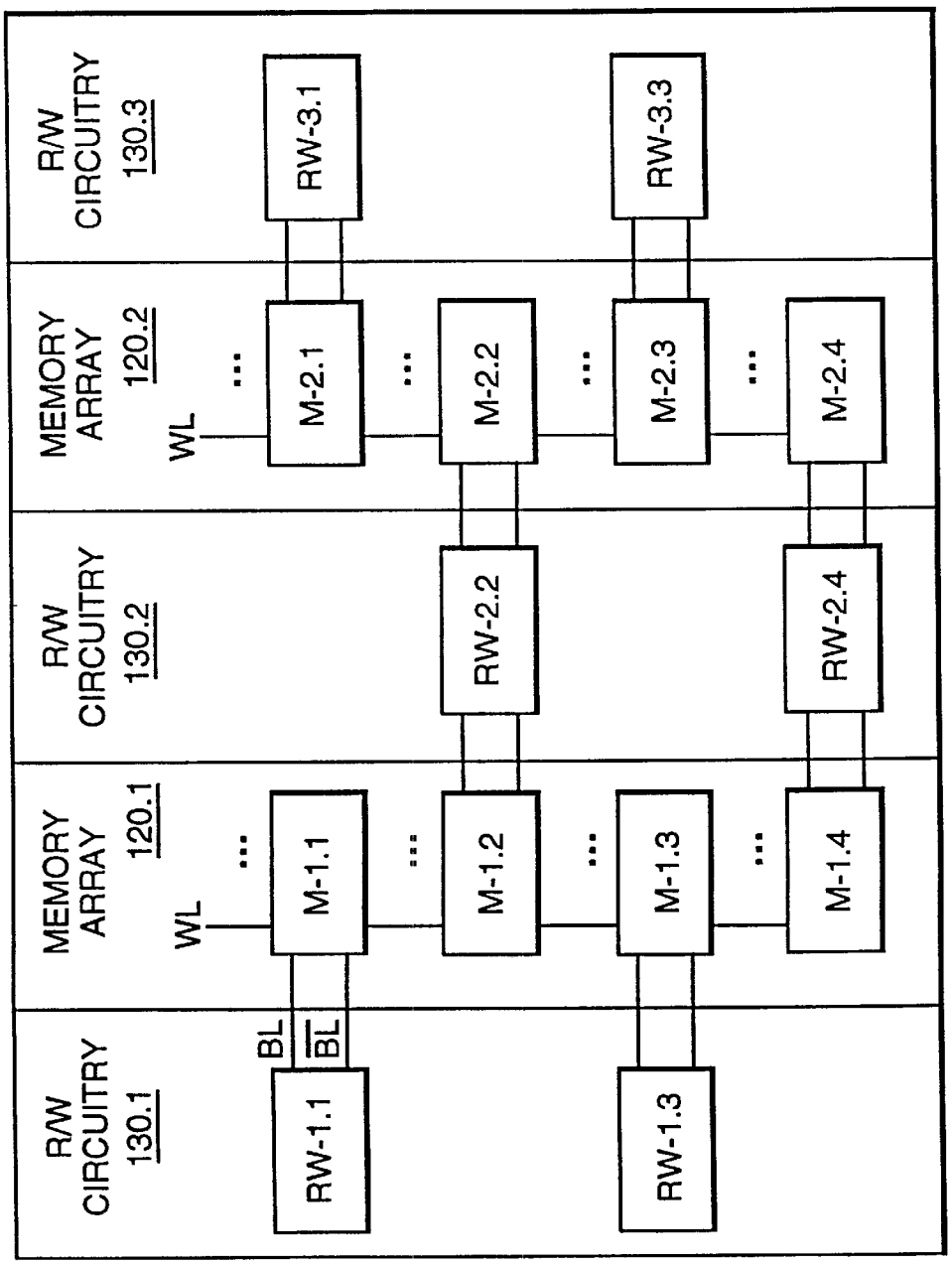
FIG. 1 is a block diagram of a DRAM according to the present invention.
Figure 2:
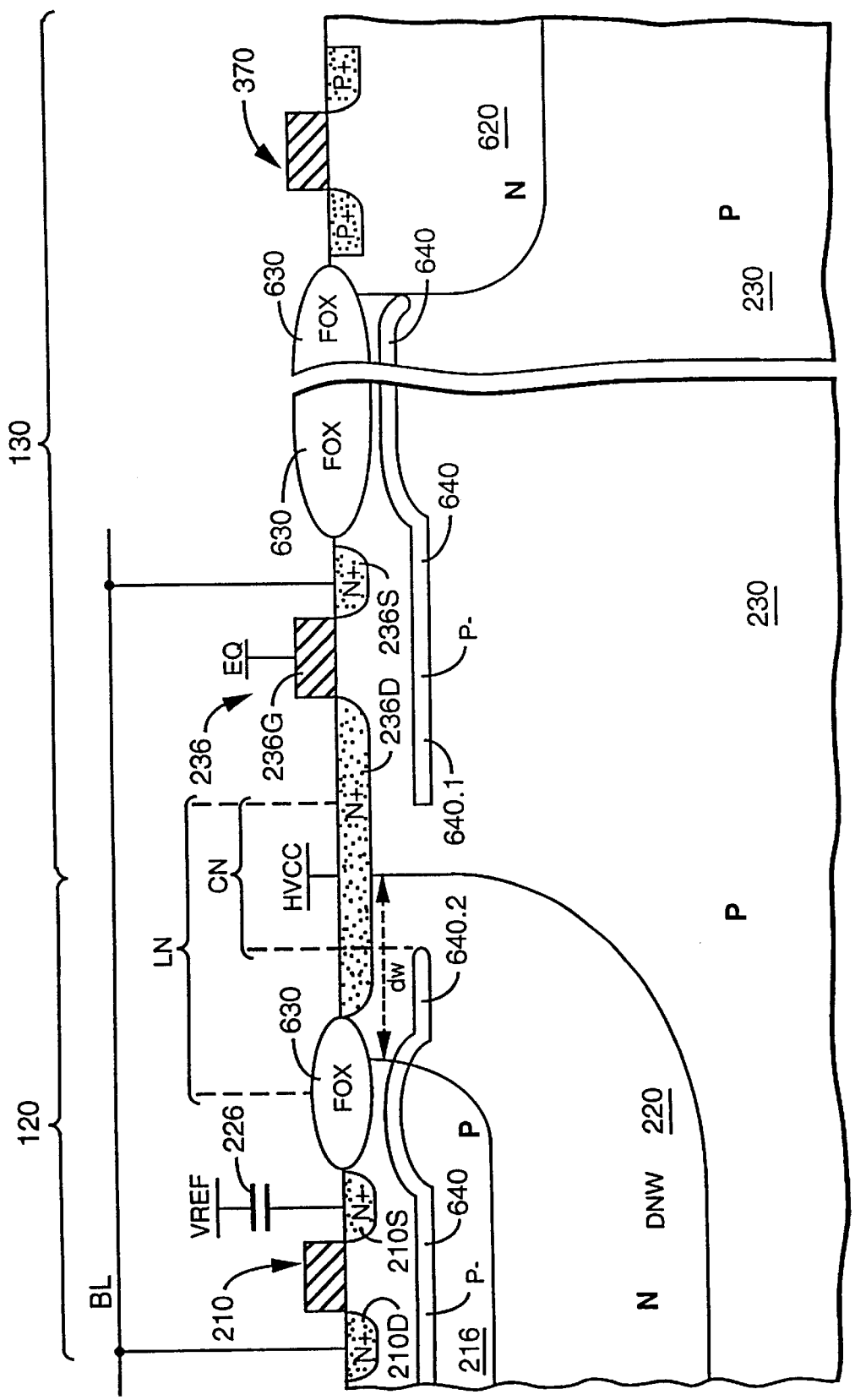
FIG. 2 shows a cross-section of a portion of the DRAM of FIG. 1.

FIG. 1 shows an integrated DRAM 110. Memory arrays 120.1, 120.2 in DRAM 110 alternate with read/write (R/W) circuitry blocks 130.1, 130.2, 130.3 along the horizontal direction in FIG. 1 (the memory column direction). Each memory array 120 is surrounded on the left and right by R/W circuitry blocks 130. Each memory array 120 is an array of memory cells. Each cell includes an NMOS transistor 210 (FIG. 2). Source regions 210S and drain regions 210D of transistors 210 of each memory array are formed in one or more P wells 216. Each P well 216 is formed in a corresponding deep N well (DNW) 220.

Drain 210D of each transistor 210 is connected to a bit line BL (or a complimentary bit line not shown in FIG. 2). Source 210S is connected to a memory capacitor 226 which is also connected to a reference voltage VREF. P well 216 is biased to a negative voltage, −1.0V in some embodiments in which VCC=3.3V, to reduce leakage through transistors 210. Deep N well 220 is biased to a positive voltage HVCC (half VCC) to isolate the P well 216 from P substrate 230. VCC is 3.3V or 5.0V in some embodiments.

In an adjacent read/write circuitry block 130 on the right of memory array 120 in FIG. 2, the transistor adjacent to DNW 220 is a bit line precharge transistor 236. Drain 236D of transistor 236 is connected to the same voltage source HVCC that biases the deep N well 220. Source 236S is connected to a bit line BL (or $\overline{BL}$). Gate 236G receives an equalization signal EQ. Signal EQ is asserted high before a memory access operation to precharge the bit lines to HVCC.

A portion of drain 236D is inside DNW 220 so that the DNW overlaps the drain 236D. Therefore, no minimal spacing is required between the R/W circuitry block 130 and the deep N well.

Similarly, in R/W block 130 on the left of the memory array (not shown in FIG. 2), a bit line precharge transistor has a drain region overlapping DNW 220. The drain region is connected to HVCC. Therefore, no minimal spacing is required.

In some embodiments, the drains of the bit line precharge transistors 236 are the only N+ contact regions in the DNW that connect the DNW to HVCC.

As seen in FIG. 1, DRAM 110 includes four boundaries between memory arrays 120 and R/W circuitry blocks 130. Hence, four minimal spacings are eliminated. The number of spacings eliminated increases with the number of memory arrays. Some 4 Mb DRAMs include 16 memory arrays, and hence 32 boundaries between memory arrays and read/write circuitry blocks. Significant size reduction is therefore achieved.

Figure 3A:
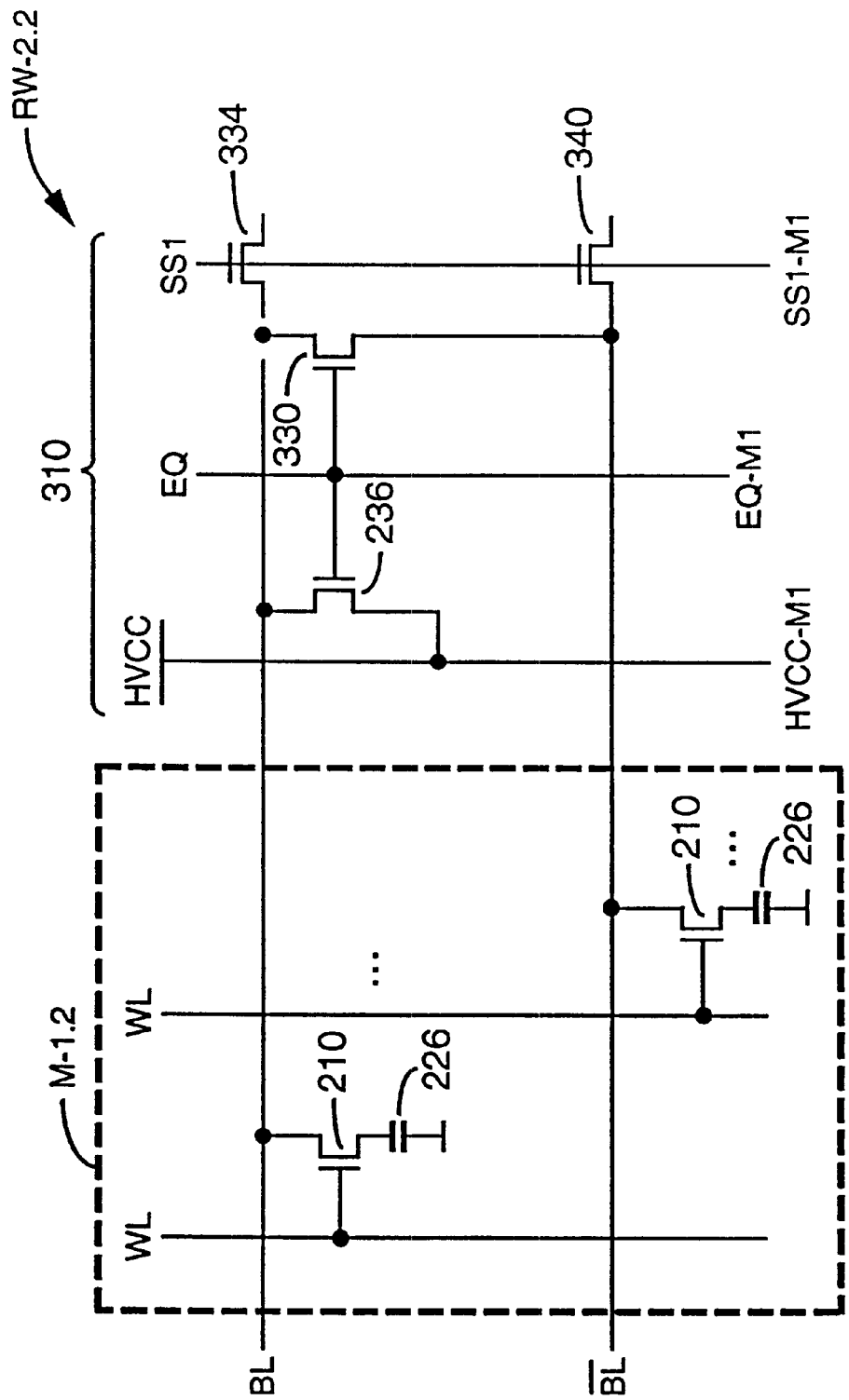
FIGS. 3A, 3B are a circuit diagram of a portion of the DRAM of FIG. 1.

In FIG. 1, memory columns and their respective bit lines BL, $\overline{BL}$, extend horizontally. Memory rows and their respective word lines WL extend vertically. Each memory array 120.i is subdivided into a number of identical memory blocks M. (A circuit diagram of block M-1.2 is shown in FIG. 3A.) Each memory block M-i.j is a single column of memory array 120.i. Each word line WL of memory array 120.i runs through all blocks M-i.j of the array. Only one pair of bit lines BL, $\overline{BL}$ runs through any given memory block M-i.j.

The bit line pair BL, $\overline{BL}$ of block M-i.j is connected to a read/write block RW-k.j (FIGS. 1–3) in an adjacent R/W circuitry block 130.k (where k=i or k=i+1) in a staggered fashion. Thus, the bit lines of memory block M-1.1 are connected to read/write block (RW block) RW-1.1 on the left of memory array 120.1. The bit lines of memory block M-1.2 are connected to RW block RW-2.2 on the right of memory array 120.1, and so on. Block RW-2.2 is also connected to memory block M-2.2. Additional details of this staggered architecture are described in U.S. patent application "DRAM With Staggered Shared Bit Line Sense Amplifier Architecture", attorney docket number M-3880 US, filed by Li-Chun Li et al. on Dec. 3, 1996 and incorporated herein by reference.

In memory block M-1.2 (FIG. 3A), and hence in every memory block M-i.j, a memory cell is located at the intersection of bit line BL with every other word line WL, and at the intersection of bit line $\overline{BL}$ with each of the remaining word lines. The gate of each memory cell transistor 210 is connected to a respective word line WL, and the drain is connected to a respective bit line BL or $\overline{BL}$.

All memory cell transistors 210 of a single memory array 120 are formed in the same P well 216 located in the same deep N well 220 (FIG. 2).

Figure 3B:
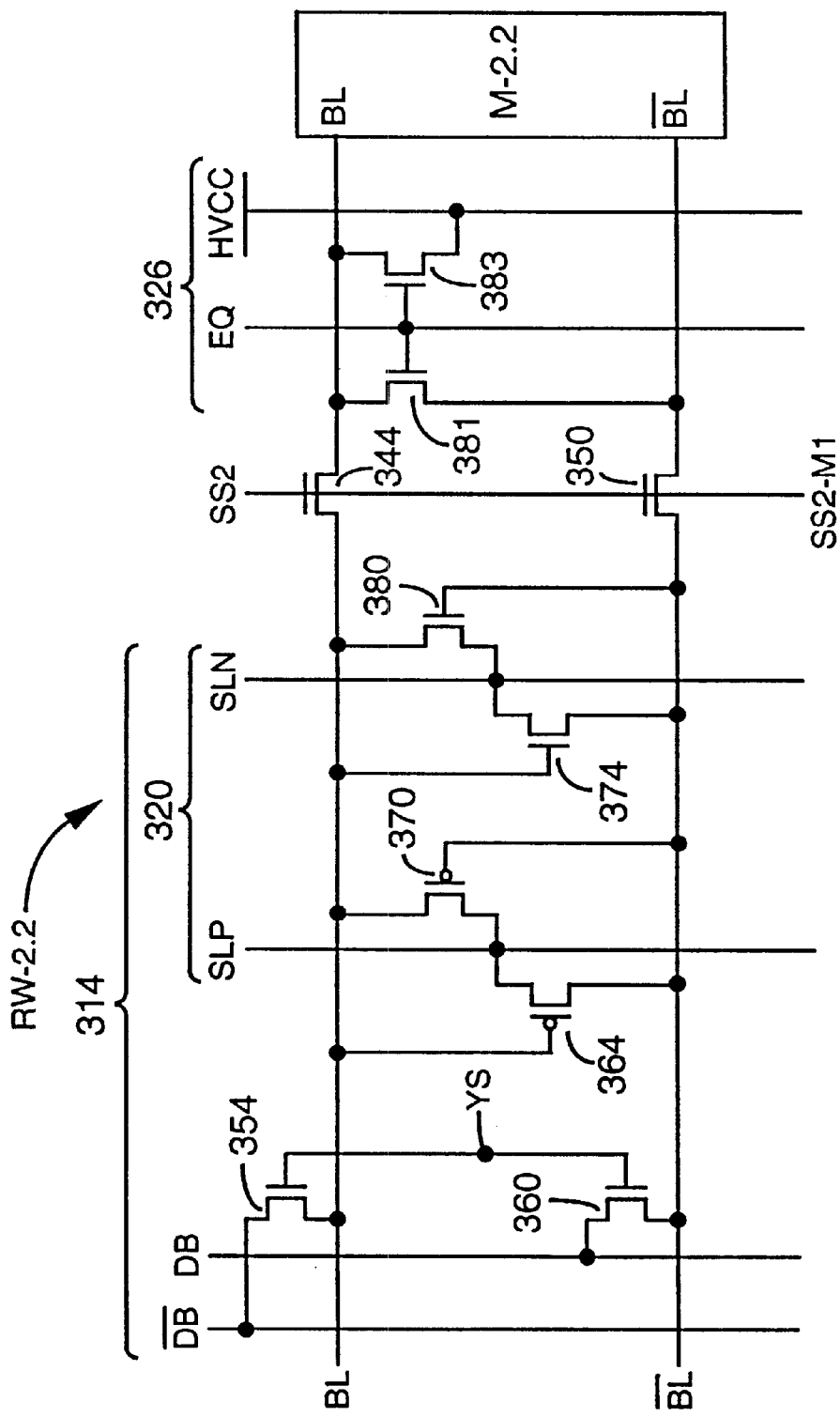

As shown in FIGS. 3A, 3B, RW block RW-1.2 includes: (1) precharge block 310 (FIG. 3A) for precharging the bit line segments running through memory block M-1.2; (2) sensing block 314 (FIG. 3B) including a sense amplifier 320; and (3) precharge block 326 for precharging the bit line segments of memory block M-2.2. All the RW blocks RW-i.j are identical to each other, except that the leftmost blocks RW-1.j omit the precharge block 310, and the rightmost blocks RW-3.j omit precharge block 326.

In precharge block 310, precharge transistor 236 (FIGS. 2, 3A) has its drain connected to a metal-1 line HVCC-M1 running vertically (in the plan view of FIGS. 1, 3A) through all the RW blocks in the R/W circuitry 130.2 (i.e. through blocks RW-2.2, RW-2.4). This metal-1 line HVCC-M1 carries the constant voltage HVCC. The source of transistor 236 is connected to bit line BL. The gate is connected to a metal-1 line EQ-M1. This line carries equalization signal EQ. Metal line EQ-M1 runs vertically through all the RW blocks of R/W circuitry 130.2.

Metal line EQ-M1 is connected also to the gate of NMOS equalization transistor 330 interconnecting the bit lines BL, $\overline{BL}$.

NMOS transistors 334, 340 connect bit line segments BL, $\overline{BL}$ of memory block M-1.2 to respective bit line segments BL, $\overline{BL}$ of sensing block 314 (FIG. 3B). Similar NMOS transistors 344, 350 connect the bit line segments of sensing block 314 to respective bit line segments of memory block M-2.2. The gates of transistors 334, 340 receive signal SS1 distributed on a vertical metal-1 line SS1-M1. The gates of transistors 344, 350 receive signal SS2 distributed on a vertical metal-1 line SS2-M1. Lines SS1-M1, SS2-M1 run through all the RW blocks of R/W circuitry 130.2. When signal SS1 is asserted high, sense amplifier 320 amplifies the signals from memory block M-1.2. When signal SS2 is asserted high, sense amplifier 320 amplifies signals from memory block M-2.2. At most one of signals SS1, SS2 is high at any given time.

In sensing block 314, bit line BL is connected to a source/drain region of NMOS pass transistor 354. The other source/drain region of pass transistor 354 is connected to data bit output line $\overline{DB}$. Bit line $\overline{BL}$ is connected to a source/drain region of pass transistor 360 whose other source/drain region is connected to complimentary data bit output line DB. The gates of transistors 354, 360 receive a column select signal YS. Data lines $\overline{DB}$, DB are metal-1 lines running vertically through all the RW blocks of R/W circuitry 130.2.

PMOS transistors 364, 370 and NMOS transistors 374, 380 form two cross-coupled latches which form sense amplifier 320. Bit line BL is connected to the gates of transistors 364, 374, and the drains of transistors 370, 380. Bit line $\overline{BL}$ is connected to the gates of transistors 370, 380, and the drains of transistors 364, 374. The sources of PMOS transistors 364, 370 are connected to a vertical metal-2 line SLP. The sources of NMOS transistors 374, 380 are connected to a vertical metal-2 line SLN. Lines SLP, SLN run through all the RW blocks of R/W circuitry 130.2. During amplification, line SLP is connected to a positive voltage, and line SLN is connected to ground. During precharge, both lines SLP, SLN are connected to the same precharge voltage HVCC. The sense amplifier operation and timing are described in U.S. patent application "Charging a Sense Amplifier", serial number 08/760,121, now U.S. Pat. No. 5,768,200 filed Dec. 3, 1996 by L. Liu et al. and incorporated herein by reference.

Precharge block 326 is similar to block 310. In particular, block 326 includes NMOS equalization transistor 381 connected between the bit lines BL, $\overline{BL}$ and NMOS precharge transistor 383 connected to bit line BL. The drain of transistor 383 is connected to a vertical metal-1 line receiving the voltage HVCC and running through all the RW blocks of circuitry 130.2. The gates of transistors 381, 383 receive equalization signals EQ provided on a vertical metal-1 line running through all the RW blocks of circuitry 120.2. The drain of transistor 383 overlaps with the deep N well (not shown) of memory block M-2.2.

Figure 4A:
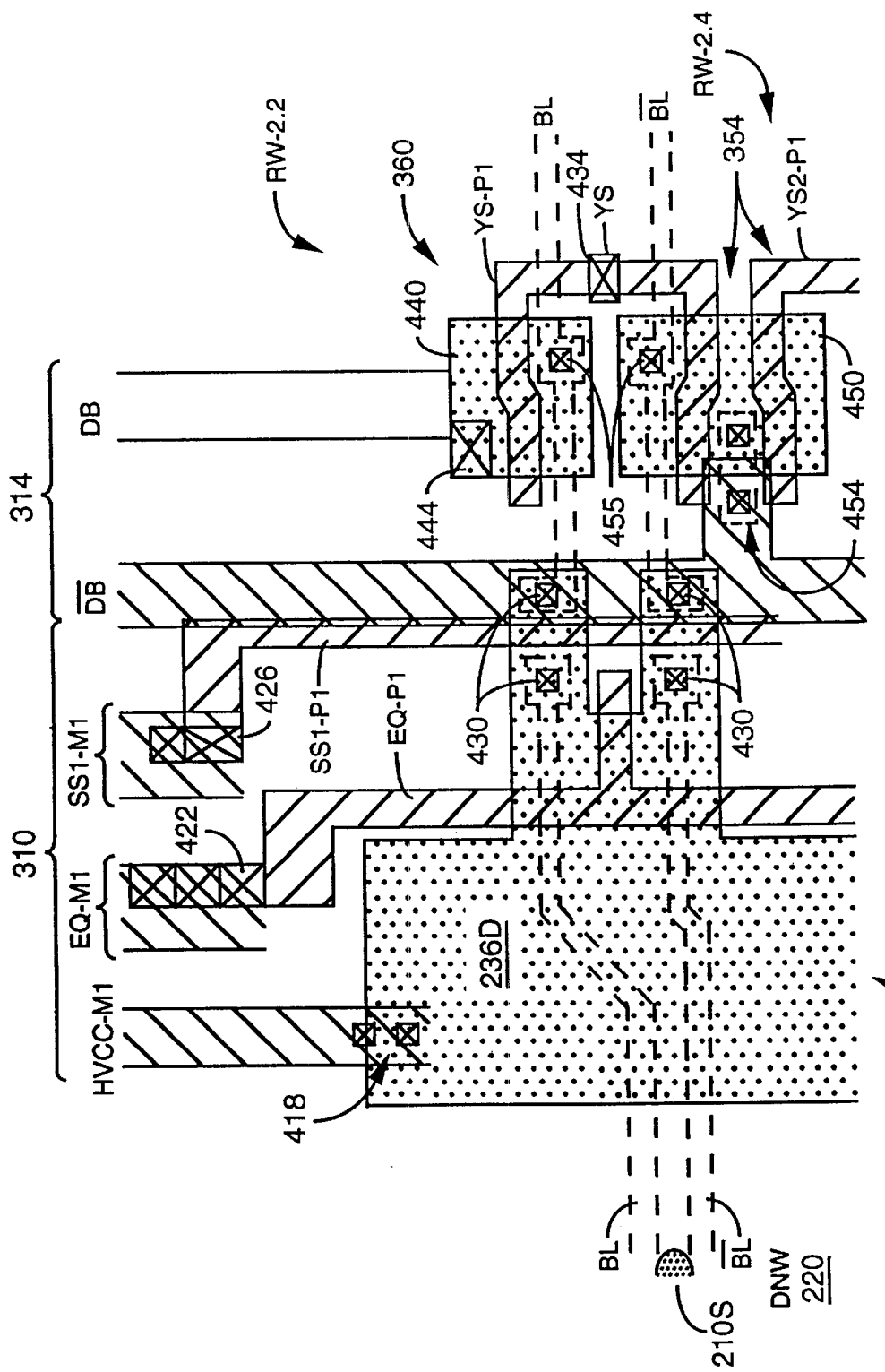
FIGS. 4A, 4B are a top layout view of the portion of the DRAM of FIG. 1.
Figure 4B:
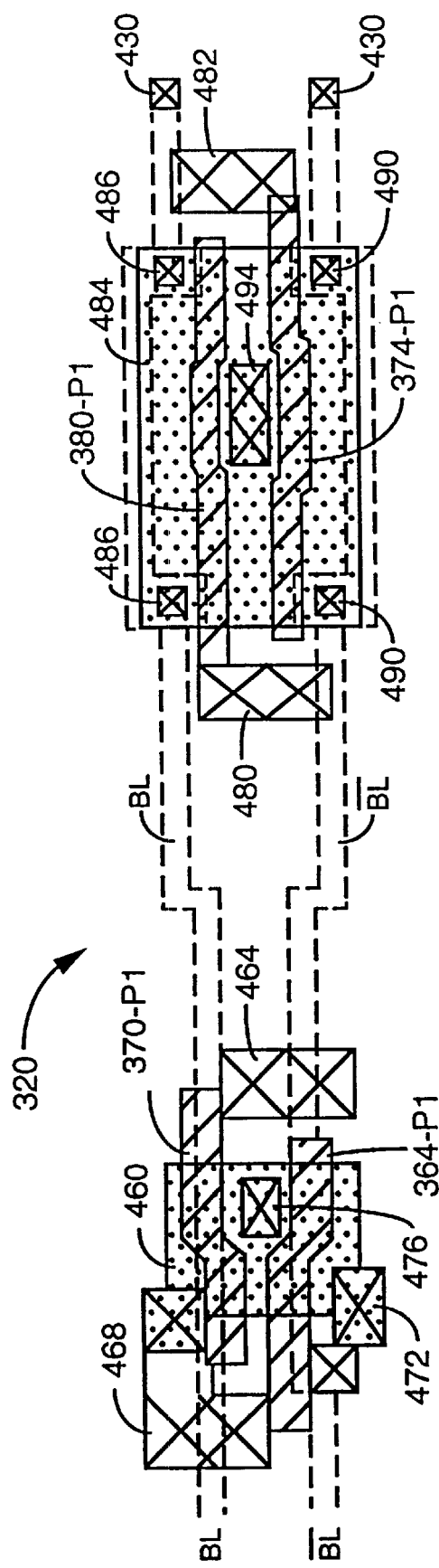

FIGS. 4A, 4B are a layout view showing tasks used to manufacture the blocks 310, 314. DRAM 110 includes four polysilicon layers and two metal layers over the polysilicon layers. Bit lines BL, $\overline{BL}$ are formed from the fourth polysilicon layer ("poly 4"). The bit line boundaries are shown by dashed lines.

Stippled areas are mask openings through which N+ or P+ implants are performed into substrate 230. Stippled region 210S is the N+ source region of transistor 210 of the rightmost memory cell of memory block M-1.2. See also FIG. 2. In capacitors 226 (FIG. 2), the capacitor plates connected to memory cell transistors 210 are formed from the second polysilicon layer (not shown). The capacitor plate connected to voltage VREF is formed from the third polysilicon layer (not shown). This plate is shared by a number of memory blocks in a memory array. This poly-3 plate is interrupted between some memory blocks M-i.j of the array to allow metal-1 word lines WL to contact poly-1 word lines WL (each word line WL includes a metal-1 line running over a poly-1 line).

Stippled region 410 (FIG. 4A) includes N+ drain 236D of precharge transistor 236.

Metal-1 line HVCC-M1 contacts drain region 236D in contact region 418. (In region 418, line HVCC-M1 contacts a doped poly-4 region. The poly-4 region contacts the drain region.)

Metal-1 line EQ-M1 contacts a poly-1 line EQ-P1 in region 422. Poly-1 line EQ-P1 provides the gates for transistors 236, 330 (FIG. 3A).

Poly-1 line SS1-P1 provides the gates of transistors 334, 340. Line SS1-P1 contacts metal line SS1-M1 in region 426. Bit lines BL, $\overline{BL}$ contact the source/drain regions of transistors 334, 340 in contact regions 430.

Poly-1 line YS-P1 provides the gates of pass transistors 354, 360. Poly-1 line YS-P1 contacts a metal-1 region in contact region 434. The metal-1 region contacts a metal-2 region which provides Y-select signal YS. Stippled region 440 includes source and drain regions of transistor 360. (Region 440 is a mask opening through which the dopant is implanted. This implant is also masked by poly-1 line YS-P1, causing the source and drain regions to be spaced from each other.) A source/drain region of transistor 360 contacts the metal-1 line DB in region 444.

Similarly, stippled region 450 includes the source and drain regions of transistor 354 of RW block RW-2.2 and of transistor 354 of the next RW block RW-2.4. Poly-1 line YS2-P1 provides the gates of the pass transistors of RW block RW-2.4. The common source/drain region of transistors 354 of the two RW blocks contacts the data line $\overline{DB}$ in contact region 454.

Bit lines BL, $\overline{BL}$ contact the source/drain regions of transistors 360, 354 in contact regions 455.

In FIG. 4B, poly-1 line 364-P1 extending essentially directly below the bit line $\overline{BL}$ provides the gate of transistor 364. Poly-1 line 370-P1 extending essentially directly below the bit line BL provides the gate of transistor 370. Stippled region 460 includes the P+ sources and drains of the two PMOS transistors. Line 370-P1 contacts bit line $\overline{BL}$ in contact region 464. Poly-1 line 364-P1 contacts bit line BL and the drain of transistor 370 in contact region 468. Bit line $\overline{BL}$ contacts the drain of transistor 364 in contact region 472. Metal-2 line SLP (not shown in FIG. 4B) contacts the common source of transistors 364, 370 in contact region 476.

Poly-1 line 374-P1 provides the gate of transistor 374. Poly-1 line 380-P1 provides the gate of transistor 380. The two poly-1 lines extend between the bit lines essentially in parallel with the bit lines. Poly-1 line 380-P1 contacts bit line $\overline{BL}$ in contact region 480. Poly-1 line 374-P1 contacts bit line BL in contact region 482.

Stippled region 484 includes the sources and drains of transistors 374, 380. Bit line BL contacts the drain of transistor 380 in contact regions 486. Bit line $\overline{BL}$ contacts the drain of transistor 374 in contact regions 490. Metal-2 line SLN (not shown) contacts the common source of transistors 374, 380 in contact region 494.

Bit lines BL, $\overline{BL}$ contact the source/drain regions of transistors 344, 350 (FIG. 3B) in contact regions 430 (FIG. 4B). Transistors 344, 350 are not shown in FIG. 4B.

Figure 5:
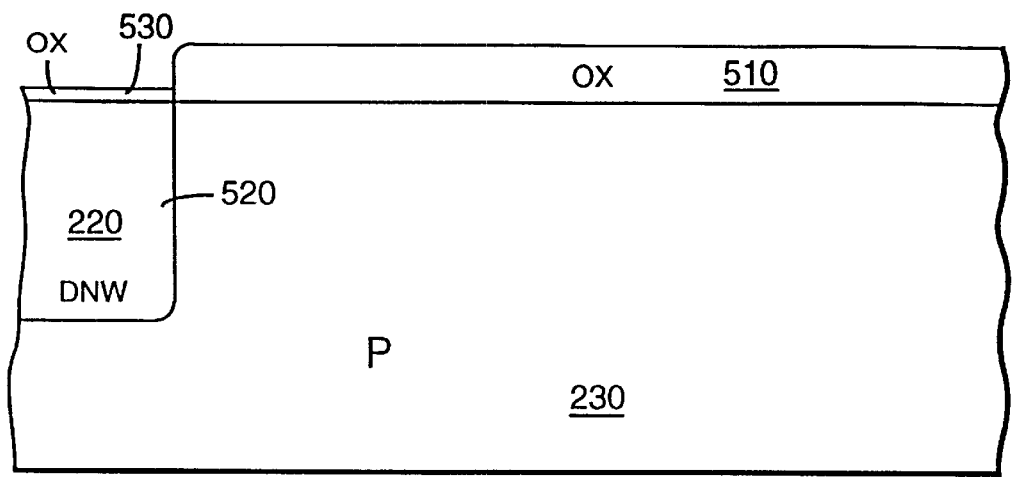
FIGS. 5 and 6 are cross-section illustrations of the DRAM of FIG. 1 in the process of fabrication.

FIG. 5 shows the beginning stages of fabrication of DRAM 110. Wafer 230 doped with boron has a doping concentration of $3 \times 10^{15}$ cm$^{-3}$. Initial silicon dioxide layer 510 is grown by thermal oxidation to a thickness of 300 to 1000 nm. Oxide 510 is patterned by standard photolithographic techniques to expose a region 520 into which dopants will be implanted for P well 216 and DNW 220.

A protective silicon dioxide layer 530 is grown by thermal oxidation to a thickness of 30 to 300 nm (100 nm in some embodiments). Phosphorous is implanted into region 520 at the energy 180 keV to create DNW 220. The ion dose is 1 to 9 times $10^{13}$ atoms/cm$^2$ ($1.5 \times 10^{13}$ atoms/cm$^2$ in some embodiments.)

Figure 6:
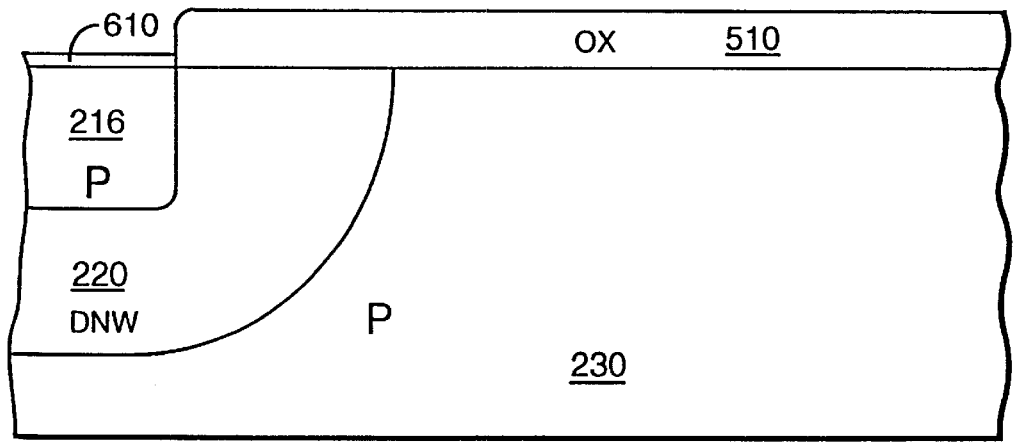

Phosphorous is driven in by heating the wafer in nitrogen atmosphere at a temperature of 1150° C. for 510 to 1000 minutes (950 minutes in some embodiments). The deep N well diffuses laterally and downward as shown in FIG. 6.

A blanket etch removes protective oxide 530 and a small portion of oxide 510. Protective silicon dioxide 610 is grown thermally to a thickness of 30 to 300 nm (100 nm in some embodiments) by wet oxidation performed at 950° C. for 10 to 60 minutes. Boron is implanted at an energy of 30 to 180 keV (60 keV in some embodiments) to form P well 216. The ion dose is $1 \times 10^{13}$ to $9 \times 10^{13}$ cm$^{-2}$ ($2 \times 10^{13}$ cm$^{-2}$ in some embodiments).

Then oxide layers 510, 610 are removed. A protective 100 nm layer of silicon dioxide ("third protective oxide", not shown) is grown by wet oxidation performed at 950° C. for 10 to 60 minutes. Photoresist (not shown) is deposited and patterned to expose N well regions 620 (FIG. 2) in which the PMOS transistor 370 and other PMOS transistors will be formed. Phosphorous is implanted at an energy of 30 to 180 keV to form the N wells. The ion dose is $1 \times 10^{13}$ to $9 \times 10^{13}$ cm$^{-2}$ ($1.2 \times 10^{13}$ cm$^{-2}$ in some embodiments). Then a well drive-in step is performed at a temperature of 1150° C. for 200 to 800 minutes (250 minutes in some embodiments). The resulting depth of DNWs 220 is about 5 μm. The depth of P wells 216 is 2 μm. The depth of N wells 620 is 3 μm. The distance dw between the right edge of P well 216 and the right edge of respective DNW 220 is 2 μm.

The third protective oxide is removed 470 nm thick field oxide regions 630 are grown between transistor active areas by LOCOS oxidation performed at 1000° C. for 90 minutes using methods known in the art.

A 30 nm sacrificial layer of silicone dioxide (not shown) is grown by wet oxidation performed at 850° C. for 40 minutes. Blanket ion implantation of BF2 is performed through this sacrificial oxide at an energy of 70 keV to adjust transistor threshold voltages. The ion dose is $3.2\times10^{12}$ cm$^{-2}$.

Then a deep P type implant (channel stop implant) is performed into NMOS transistor active regions to enhance the P type dopant concentration under the NMOS transistors and the field oxide regions. The resulting P-channel stop regions are shown at 640. Regions 640 increase the punch-through voltages of NMOS transistors and parasitic transistors formed under field oxide 630. Regions 640 also increase the parasitic transistor threshold voltages. Regions 640 are formed by implanting boron at the energy 120 keV The ion dose is $8\times10^{12}$ atoms/cm$^2$. The implant mask protects N wells 620 during this implant. The implant mask also protects regions CN of equalization transistor drains 236D. Each region CN overlaps an area in which the respective drain 236D meets the respective DNW 220. Protecting the regions CN from the channel stop implant serves to improve the electrical contact between drains 236D and DNWs 220.

In some embodiments, the channel stop implant mask is the reverse of the N well 620 mask except that the channel stop implant mask also covers regions CN.

Each region CN is spaced from the respective gate 236G. This spacing allows a portion 640.1 of channel stop region 640 to extend under the drain 236D, thus increasing the punch-through voltage of transistor 236. Each region CN is also spaced from the edge of the respective drain 236D where the drain meets field oxide 630 (the left edge of drain 236D in FIG. 2). This spacing allows a portion 640.2 of channel stop region 640 to extend from under the field oxide to a region under the drain 236D. This helps to improve the punch-through voltage and the threshold voltage of the field transistor formed at the location of oxide 630.

In some embodiments, after formation of the implant mask used to form channel stop regions 640, but before the boron implantation forming the channel stop regions, another boron implant is performed through the sacrificial oxide at an energy of 30 keV to adjust the threshold voltages of NMOS transistors. The ion dose of this implant is $2\times10^{12}$ cm$^{-2}$.

After the channel stop implant, the sacrificial oxide is removed.

Gate oxide (not shown) is grown to a thickness of 5 to 18 nm (8 nm in some embodiments) by oxidizing the structure at 700 to 1000° C. (850° C. in some embodiments) for 10 to 60 minutes. Polysilicon or polycide gates of transistors 210, 236, 370, and other transistors, are formed by known techniques. Phosphorous is ion-implanted at 25 keV to form LDD regions of NMOS transistors. The ion dose a $2\times10^{13}$ cm$^{-2}$. Then pocket ion implantation of boron is performed at an angle of 25° and an energy of 60 keV into regions underlying NMOS sources and drains, to increase the NMOS punch-through voltages. The pocket implant ion dose is $1.2\times10^{13}$ cm$^{-2}$. These two implants—NMOS LDD and P-type pocket—are performed using the same photoresist mask ("NMOS LDD mask", not shown) patterned by standard photolithographic techniques. The mask covers regions LN one of which is shown in FIG. 2. Each region LN covers the region CN and extends to the adjacent field oxide region 630 separating the respective drain 236D from the respective P well 216. By covering the regions LN, the mask blocks the pocket-implant boron from areas in which the drain regions 236D meet the respective DNWs 220. Thus, the mask helps to improve the contact between drain regions 236D and DNWs. At the same, the mask exposes a portion of the drains 224D adjacent the respective gates 236G and also exposes the source regions 236S.

Pocket implants are described in U.S. Pat. No. 5,618,740 entitled "Method of Making CMOS Output Buffer with Enhanced ESD Resistance", issued Apr. 8, 1997 to T. Huang and incorporated herein by reference.

BF2 is implanted to form LDD regions of PMOS transistors such as transistor 370. A pocket implant of phosphorous is performed into the PMOS transistor regions to increase their punch-through voltages. A 100 nm layer of silicone nitride (not shown) is deposited by LPCVD and etched to form spacers on transistor gate sidewalls. The silicon nitride deposition temperature is 780° C., and the deposition time is 40 mins. A 20 nm layer of silicone dioxide (not shown) is grown at 875° C. on exposed silicone surfaces. Arsenic and BF2 are implanted in successive ion implantation steps. The arsenic implant forms heavily doped portions of NMOS source/drain regions. The BF2 implant forms heavily doped portions of PMOS source/drain regions and also forms one or more P+ contact regions (not shown) in each P well 216. The P+ contact regions will contact a voltage source that will bias the P-wells. In some embodiments the mask used in the BF2 implant is the reverse tone of the NMOS LDD mask, except that both the NMOS LDD mask and the BF2 mask block the regions LN.

Remaining fabrication steps are known in the art.

The dopant concentration in DNWs 220 is $1\times10^{16}$ atoms/cm$^3$. The dopant concentration in drains 236D is $1\times10^{20}$ atoms/cm$^3$. The higher dopant concentration in the drain regions improves the electrical contact between DNWs 220 and doped poly-4 regions (not shown) contacting the drains 236D and also contacting the metal-1 lines HVCC-M1.

Figure 7:
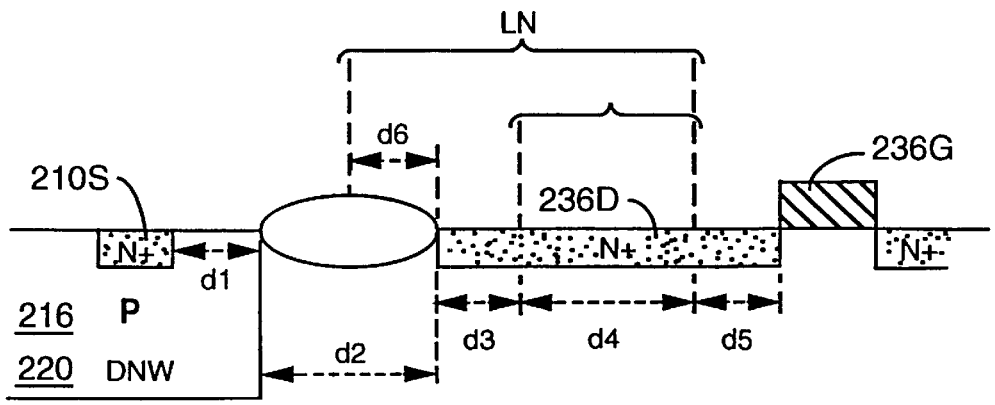
FIG. 7 is a cross-sectional view showing drawn dimensions in some embodiments of FIG. 1.

FIG. 7 illustrates some drawn mask dimensions in the cross section of FIG. 2. The lateral distance d1 between the right edge of the rightmost source region 210S in a P well 216 and the right edge of the respective DNW 220/P well 216 mask opening (corresponding to the left edge of oxide 510 in FIG. 5) is only 0.45 μm. This spacing is small due to elimination of a separate N+ contact region in the DNW and of a separate N well containing the N+ contact region. The distance d2 between the right edge of the DNW mask opening and the left edge of the mask opening for drain region 236D is 1.5 μm. The drawn distance d2 between the left edge of the region 236D and the left edge of the region CN is 0.4 μm. The width d4 of each region CN is 3.1 μm. The distance d5 between the right edge of the region CN and the left edge of gate 236G is 1.0 μm.

The distance d6 between the left edges of region LN and drain 236D is 1.0 μm. The rights edges of regions LN, CN coincide.

In this embodiment, DNW 220 diffuses laterally after implantation by 75–80% of the DNW depth. Thus, if the DNW depth is 5 μm, the DNW diffuses laterally by 3.75 μm to 4 μm. The minimal photolithographic line width is 0.5 μm, and the maximum alignment error is 0.6 μm. The minimal spacing between the DNW mask and the gate of the nearest transistor is only d2+d3+d4+d5=6 µm.

The above embodiments illustrate but do not limit the invention. In particular, the invention is not limited by any particular dimensions, fabrication techniques, temperatures, energies, or other process parameters, or by layer compositions or layout. The invention is not limited to DRAMs or any other particular circuitry. Other embodiments and variations are within the scope of the invention as defined by the following claims.

What is claimed is:

1. A method for fabricating an integrated circuit comprising one or more dynamic random access memory cells, the method comprising:

introducing a dopant of a first conductivity type into a semiconductor substrate to form one or more well W1 of the first conductivity type;

introducing a dopant of a second conductivity type into the well(s) W1 to form a second-conductivity-type well W2 in each well W1, wherein each well W2 is for containing electrodes of one or more transistors of the DRAM cell(s);

introducing a dopant of the first conductivity type to form one more wells W3 of the first conductivity type, wherein each well W3 is for holding second-conductivity-type electrodes of one or more transistors, and wherein each well W3 does not overlap with any well W1;

introducing a dopant D1 of the second conductivity type into one or more substrate regions which are for containing first-conductivity-type electrodes of transistors, the dopant D1 being blocked from: (1) each well W3, and (2) at least a portion of each well W1 which portion is for containing a low-resistance contact region LC1 for contacting the well W1.

2. The method of claim 1 wherein the dopant D1 is introduced into one or more regions between transistors to improve insulation between transistors.

3. The method of claim 1 wherein for at least one well W1, the respective low-resistance contact region is a region of an electrode E1 of a transistor T1.

4. The method of claim 3 wherein the transistor T1 has a first electrode adjacent to the electrode E1 but spaced from the respective low-resistance contact region LC1, such that at least a portion of the dopant D1 is introduced into a region underlying the electrode E1 and adjacent to said first electrode, thereby increasing the punch-trough voltage of transistor T1.

5. The method of claim 3 wherein the dopant D1 is introduced into an entire field region separating the electrode E1 of transistor T1 from another transistor.

6. The method of claim 3 wherein the dopant D1 is introduced into a field region and into a region underlying the electrode E1 and adjacent to the field region, thereby reducing current leakage through the field region.

7. The method of claim 3 wherein the electrode E1 is to be biased at a voltage to bias the well W1 overlapping the electrode E1 and to controllably couple said voltage to another electrode of transistor T1.

8. A method for fabricating an integrated circuit comprising one or more dynamic random access memory cells, the method comprising:

introducing a dopant of a first conductivity type into a semiconductor substrate to form one or more wells W1 of the first conductivity type;

introducing a dopant of a second conductivity type into the well(s) W1 to form a second-conductivity-type well W2 in each well W1, wherein each well W2 is for containing electrodes of one or more transistors of the DRAM cell(s);

introducing a dopant of the first conductivity type to form one more wells W3 of the first conductivity type, wherein each well W3 is for holding second-conductivity-type electrodes of one or more transistors, and wherein each well W3 does not overlap with any well W1;

introducing a dopant D1 of the second conductivity type into one or more substrate regions which are to isolate transistors from each other, the dopant D1 being blocked from: (1) each well W3, and (2) at least a portion of each well W1 which portion is for containing a low-resistance contact region for contacting the well W1.

* * * * *

UNITED STATES PATENT AND TRADEMARK OFFICE
CERTIFICATE OF CORRECTION

PATENT NO. : 6,406,953 B1
DATED : June 18, 2002
INVENTOR(S) : Li, Li-Chun et al.

It is certified that error appears in the above-identified patent and that said Letters Patent is hereby corrected as shown below:

Column 9,
Line 16, delete "well" and insert -- wells --; and

Column 10,
Line 4, delete "trough" and insert -- through --.

Signed and Sealed this

Twenty-fifth Day of February, 2003

JAMES E. ROGAN
*Director of the United States Patent and Trademark Office*